US008461906B2

(12) United States Patent
Acharya et al.

(10) Patent No.: US 8,461,906 B2
(45) Date of Patent: Jun. 11, 2013

(54) CELL-BASED INTEGRATED CIRCUIT AND A METHOD OF OPERATING A THYRISTOR CIRCUIT IN A STANDARD CELL OF A CELL-BASED INTEGRATED CIRCUIT

(75) Inventors: Pramod Acharya, Munich (DE);
Ravikiran Lakshman, Bangalore (IN);
Prashant Kashinkunti, Dharwad (IN)

(73) Assignee: Infineon Technologies AG, Neubiberg (DE)

( * ) Notice: Subject to any disclaimer, the term of this patent is extended or adjusted under 35 U.S.C. 154(b) by 409 days.

(21) Appl. No.: 12/416,200

(22) Filed: Apr. 1, 2009

(65) Prior Publication Data
US 2009/0278584 A1    Nov. 12, 2009

(30) Foreign Application Priority Data
May 9, 2008  (DE) .......................... 10 2008 023 126

(51) Int. Cl.
*H03K 17/72*  (2006.01)
(52) U.S. Cl.
USPC ........................................................ 327/438
(58) Field of Classification Search
None
See application file for complete search history.

(56) References Cited

U.S. PATENT DOCUMENTS

| 4,456,836 | A | * | 6/1984 | Matsuda et al. | 327/442 |
|---|---|---|---|---|---|
| 4,740,723 | A | * | 4/1988 | Sugayama et al. | 327/440 |
| 4,808,860 | A | | 2/1989 | Labrousse | |
| 4,868,903 | A | | 9/1989 | Corbett | |
| 5,030,862 | A | * | 7/1991 | Prentice | 327/441 |
| 5,323,028 | A | * | 6/1994 | Nishizawa et al. | 257/136 |
| 5,726,946 | A | | 3/1998 | Yamagata | |
| 5,777,506 | A | * | 7/1998 | Kurachi et al. | 327/440 |
| 6,396,306 | B2 | | 5/2002 | Dring | |
| 6,836,179 | B2 | | 12/2004 | Mizuno | |
| 7,405,435 | B2 | * | 7/2008 | Sato | 257/173 |
| 2003/0184364 | A1 | | 10/2003 | Miyagi | |

FOREIGN PATENT DOCUMENTS

| EP | 0641077 A2 | 3/1995 |
|---|---|---|
| JP | 2004229193 | 8/2004 |

* cited by examiner

*Primary Examiner* — Lincoln Donovan
*Assistant Examiner* — Khareem E Almo
(74) *Attorney, Agent, or Firm* — SpryIP, LLC

(57) ABSTRACT

A cell-based integrated circuit comprises a first supply voltage terminal and a second supply voltage terminal. A standard cell comprising a thyristor circuit comprising a first input inputs the first supply voltage. A second input inputs the second supply voltage. A first output outputs a first output voltage corresponding to the first supply voltage and a second output to output a second output voltage corresponding to the second supply voltage.

17 Claims, 6 Drawing Sheets

CELL-BASED INTEGRATED CIRCUIT AND A METHOD OF OPERATING A THYRISTOR CIRCUIT IN A STANDARD CELL OF A CELL-BASED INTEGRATED CIRCUIT

FIELD OF THE INVENTION

The present invention relates to a cell-based integrated circuit, a method of operating a thyristor circuit in a standard cell of a cell-based integrated circuit, a method of operating a thyristor circuit and a logic gate circuit in a standard cell of a cell-based integrated circuit, a switching circuit, and a method for switching a connection between a first terminal and a second terminal.

BACKGROUND OF THE INVENTION

Cell-based integrated circuits make use of a library of basic building blocks which are called cells or standard cells. Using cells from the library, larger, more complex functions can be realized. In contrast to transistor-level in situ customization of cell designs, the cells are treated as black box entities by the design and verification tools and are fully characterized for timing, noise, reliability, etc.

In cell-based integrated circuits, for example, baseband chips, spare cells can be provided in a chip to fix post tape out bugs. Such spare cells need to have their inputs to be defaulted to a constant voltage. Because of the generic design methodology at the so-called RTL (Register Transfer Level) level, it is currently quite common to end up with many unconnected inputs which by default will be tied to "0" or "1". It may happen that a particular macro architecture needs "constant voltage" at some inputs for its optimal synthesis.

In integrated circuits, particularly in cell-based integrated circuits, it may also happen that not all inputs of a logic gate are need to be used or connected to the preceding stages. In such cases, the respective inputs are either grounded or connected to supply so that they do not interfere with the intended operation of the logic gate. Until now, it was possible to connect such unused or default inputs directly to the supply or ground rail. However, with advancing technology, the shrinking gate oxide thickness prevents such direct connections of the logic gate to the voltage supply (VDD) rail or ground (VSS) rail due to electrostatic discharge (ESD) considerations.

In integrated circuits, in particular in cell-based circuits, it may also happen that entire blocks of logic are switched off when not needed in order to save power in critical circuits and to extend battery life. This is achieved by disconnecting the VDD (supply) rail or VSS (ground) rail from the logic block under consideration. However, when the logic block is again connected to the power rails, the logic block must be restored to its default state as quickly as possible. This process demands a lot of current in a short time as all capacitances associated with the block need to be recharged. These current spikes, together with the inductances and resistances of the overall power network will cause excessive voltage drops, entailing both over overshooting and undershooting, and affect the neighboring logic blocks that have not been switched off.

BRIEF DESCRIPTION OF THE SEVERAL VIEWS OF THE DRAWINGS

Aspects of the invention are made more evident in the following detailed description of some embodiments when read in conjunction with the attached drawing figures, wherein.

DETAILED DESCRIPTION OF THE INVENTION

Figure 1:
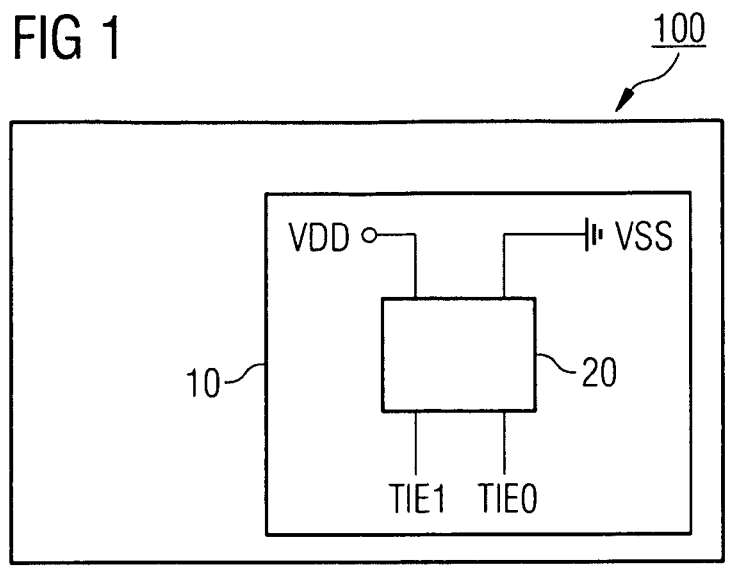
FIG. 1 shows a schematic representation of an embodiment of a cell-based integrated circuit.

The aspects and embodiments of the invention are now described with reference to the drawings, wherein like reference numerals are generally utilized to refer to like elements throughout. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. The following description is therefore not to be taken in a limiting sense, and the scope of the invention is defined by the appended claims.

Referring to FIG. 1, there is shown a schematic representation of an embodiment of a cell-based circuit. The cell-based circuit 100 as depicted in FIG. 1 comprises standard cells one of which is depicted as standard cell 10. The standard cell 10 comprises a thyristor circuit 20. In the standard cell 10 there is provided a first supply voltage which is designated as VDD 12 and a second supply voltage which is designated as VSS 14. The voltages VDD and VSS are well-known standard supply voltages in integrated circuits where VDD normally is a positive supply voltage and the VSS is the ground voltage. However, the first and second supply voltages 12, 14 can also be given by other voltages or voltage levels. The thyristor circuit 10 is provided for the purpose of delivering stable output voltages TIE0 16 and TIE1 18 corresponding to the first supply voltage 12 and the second supply voltage 14 as provided in the standard cell.

Figure 2:
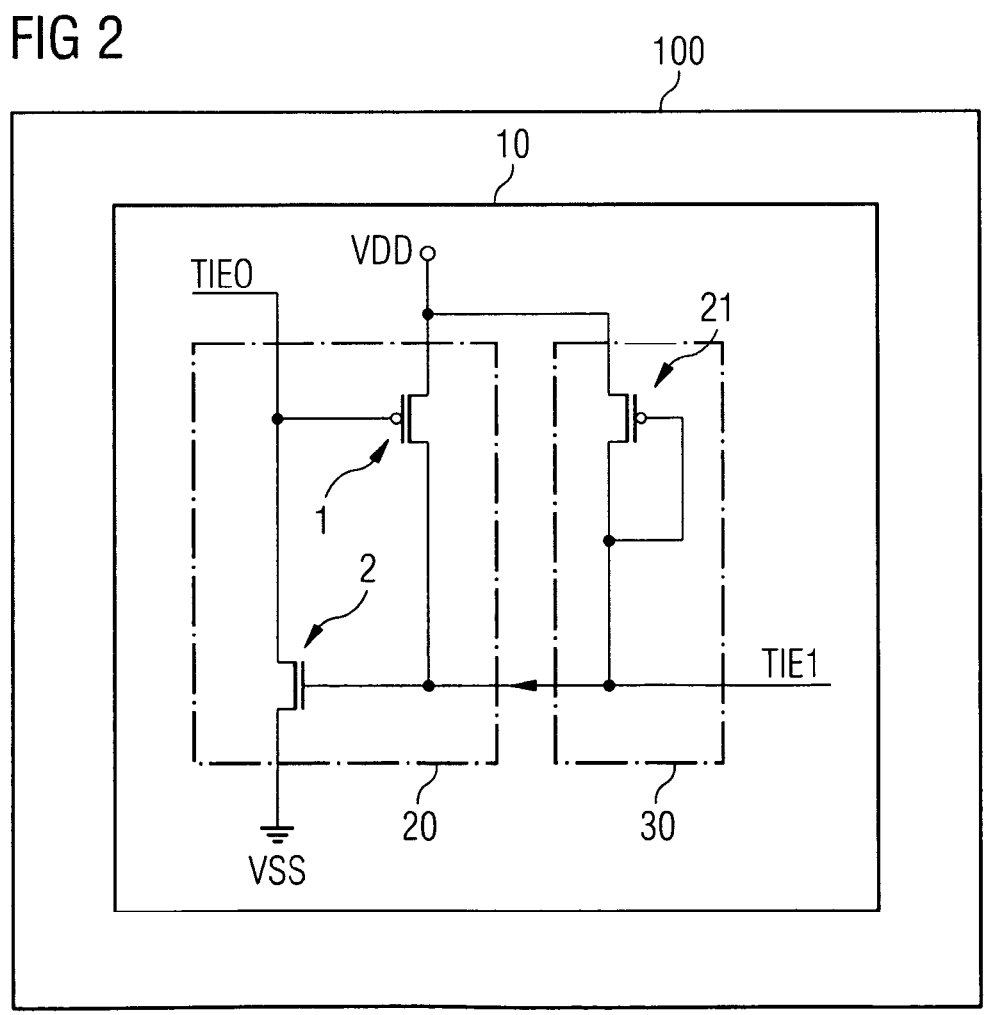
FIG. 2 shows a schematic representation of a further embodiment of a cell-based integrated circuit.

Referring to FIG. 2, there is shown a schematic representation of a further embodiment of a cell-based integrated circuit. This embodiment in principle corresponds to the embodiment as depicted in FIG. 1, but shows the thyristor circuit 20 in more detail and also a start-up device 30 coupled to the thyristor circuit 20. The thyristor circuit 20 as depicted in FIG. 2 is connected to a supply voltage (VDD) terminal 12 and a ground voltage (VSS) terminal 14. In a stable state the thyristor circuit 20 delivers a static and stable output voltage TIE1 18 corresponding to VDD 12 and a static and stable output voltage TIE0 16 corresponding to VSS 14. The thyristor circuit 20 comprises a first p-channel metal-oxide semiconductor (MOS) transistor 1 and a second n-channel MOS transistor 2. The gate of the first MOS transistor 1 is coupled to the source/drain of the second MOS transistor 2 and the gate of the second MOS transistor 2 is coupled to the source/drain of the first MOS transistor 1. One of the source/drain terminals of the first MOS transistor 1 is coupled to the VDD terminal 12 and one of the source/drain terminals of the second MOS transistor 2 is coupled to the VSS terminal.

In order to get the thyristor circuit 20 into a stable state, there can be provided a start-up device 30 for supplying a voltage to the thyristor circuit 20 as indicated by the arrow. The start-up device 30 can be provided for the purpose of starting up the thyristor circuit 20 so that the thyristor circuit 20 will quickly settle into a stable state, independent of supply ramp-up or circuit initial conditions. If the thyristor circuit 20 comprises MOS transistors the start-up device 30 can comprise, for example, any kind of a voltage generator to supply a voltage to the thyristor circuit 20. In this case, the start-up device 30 can, for example, comprise a diode, in particular a transistor diode 21, supplying a voltage to the thyristor circuit 20. The start-up device 20 can also comprise a pulse generator. If, however, the thyristor circuit is based on bipolar transistors, the start-up device can comprise, for example, any kind of a current generator to supply a current to the thyristor circuit.

In the embodiment of a cell-based integrated circuit as depicted in FIG. 2, the start-up device 30 comprises a transistor diode 21 implemented as a p-channel MOS transistor, the gate 22 of which is coupled to one of its source/drain terminals 23 whereas the other one of its source/drain terminals 24 is coupled to the VDD terminal 12. During the start-up phase, a voltage is supplied by the VDD 12 voltage through the transistor diode 21 to the gate 25 of the MOS transistor 2 of the thyristor circuit 20. Once the thyristor circuit 20 has attained a stable state, the transistor diode 21 is automatically inactivated so that it supplies no further voltage to the thyristor circuit 20. In this stable state the thyristor circuit 20 delivers the static and stable output voltages TIE0 16 and TIE1 18.

The thyristor circuit 20 as depicted in FIG. 2 is comprised of the first p-channel MOS transistor 1 and the second n-channel MOS transistor 2 connected together in a thyristor configuration. The transistor diode 21 comprising the p-channel MOS transistor feeds a voltage to the thyristor circuit 20 and initiates a positive feedback within the thyristor circuit 20 such that the thyristor circuit 20 quickly saturates and provides a robust "0" (TIE0 16, corresponding to VSS) and "1" (TIE1 18, corresponding to VDD). The transistor diode 21 is used to force the positive feedback action and ensure the circuit settles quickly into a stable state, independent of supply ramp-up or circuit initial conditions. Further, once the stable state is attained, the transistor diode 21 comprising the p-channel MOS transistor is automatically inactivated so that no further voltage is supplied to the thyristor circuit 20. Now, not only the gates 22 and 25 of the MOS transistors 1 and 2, respectively, are fully driven but also low voltage operation is feasible because of the positive feedback mechanism. The same functionality as the thyristor circuit 20 depicted in FIG. 2 is realized if the p-channel transistor diode 21 is replaced by an n-channel MOS diode and connected to the gate 25 of the first p-channel MOS transistor 1 of the thyristor circuit 20.

Figure 3:
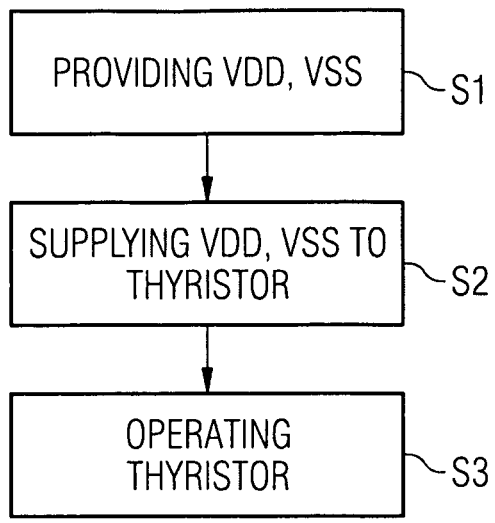
FIG. 3 shows a flow diagram representation of an embodiment of a method of operating a thyristor circuit in a standard cell of a cell-based integrated circuit.

Referring to FIG. 3 there is shown a flow diagram representation of an embodiment of a method of operating a thyristor circuit in a standard cell of a cell-based integrated circuit. In a first method step 310 a first supply voltage and a second supply voltage are provided in a standard cell of a cell-based integrated circuit. The first supply voltage can comprise the standard VDD voltage and the second supply voltage can comprise the standard VSS ground voltage. In a second step 320 the first and second supply voltages are supplied to the thyristor circuit, for example, in a way as it is depicted in the embodiment of a cell-based integrated circuit shown in FIG. 2. In a third step 320 the thyristor circuit is operated such that it delivers at a first output thereof a first output voltage corresponding to the first supply voltage and at a second output thereof a second output voltage corresponding to the second supply voltage.

If the thyristor circuit comprises MOS transistors, the third step 330 in FIG. 3 of operating the thyristor circuit can comprise starting up the thyristor circuit by supplying an external voltage to the thyristor circuit. On the other hand, if the thyristor circuit comprises bipolar transistors, the third step 330 can comprise starting up the thyristor circuit by supplying an external current to the thyristor circuit.

One further aspect is related to a method of operating a thyristor circuit and a logic gate circuit in a standard cell of a cell-based integrated circuit, wherein the thyristor circuit is operated such that it delivers at a first node thereof a first voltage (TIE1 18, FIG. 2) corresponding to a first supply voltage, e.g., VDD, of the cell-based integrated circuit and at a second node thereof a second voltage (TIE0 16) corresponding to a second supply voltage, e.g. VSS, 14 of the cell-based integrated circuit, and an input of a logic gate circuit is connected to the first node or to the second node of the thyristor circuit.

Figure 4:
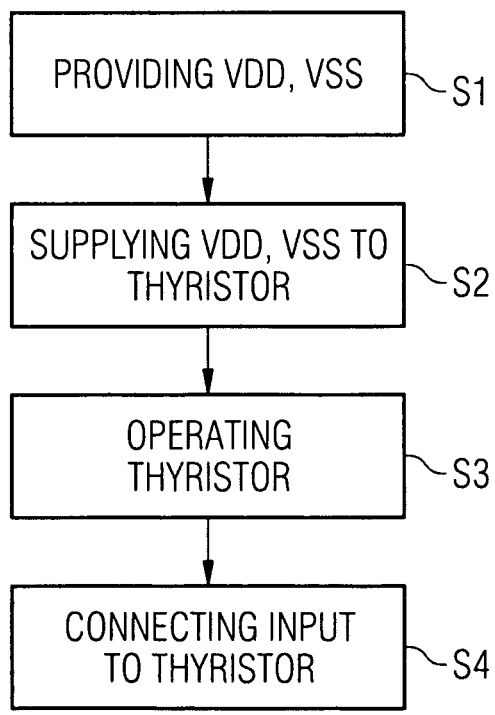
FIG. 4 shows a flow diagram representation of an embodiment of a method of operating a thyristor circuit and a logic gate circuit in a standard cell of a cell-based integrated circuit.

Referring to FIG. 4, there is shown a flow diagram representation of an embodiment of a method of operating a thyristor circuit and a logic gate circuit in a standard cell of a cell-based integrated circuit. In a first method step 310 a first supply voltage and a second supply voltage are provided in a standard cell of a cell-based integrated circuit. The first supply voltage can comprise the standard VDD voltage and the second supply voltage can comprise the standard VSS ground voltage. In a second step 320 the first and second supply voltages are supplied to the thyristor circuit, for example, in a way as it is depicted in the embodiment of a cell-based integrated circuit shown in FIG. 2. In a third step 330 the thyristor circuit is operated such that it delivers at a first output thereof a first output voltage corresponding to the first supply voltage and at a second output thereof a second output voltage corresponding to the second supply voltage. In a fourth step 410 an input of the logic gate circuit is connected to the first output or to the second output of the thyristor circuit. It should be noted that the order of the steps 310 to 410 as outlined above can be changed. In particular the step 410 can be performed as first, second, third or fourth step.

If the thyristor circuit comprises MOS transistors, the third step 310 in FIG. 4 of operating the thyristor circuit can comprise starting up the thyristor circuit by supplying an external voltage to the thyristor circuit. On the other hand, if the thyristor circuit comprises bipolar transistors, the third step 330 can comprise starting up the thyristor circuit by supplying an external current to the thyristor circuit.

In the fourth step 410 it can be the case that, for operating a logic gate, an input thereof is never used nor connected to the preceding stage. In this case such an input would be permanently coupled to the first output or to the second output of the thyristor circuit. However, there can also be the case that an input of a logic gate is used or connected to a preceding stage in a normal of the logic gate circuit, but not needed or disconnected from the preceding stage in predetermined situations. In these predetermined situations, the input could then also be connected to the first output or the second output of the thyristor circuit in step 410 of FIG. 4.

Figure 5:
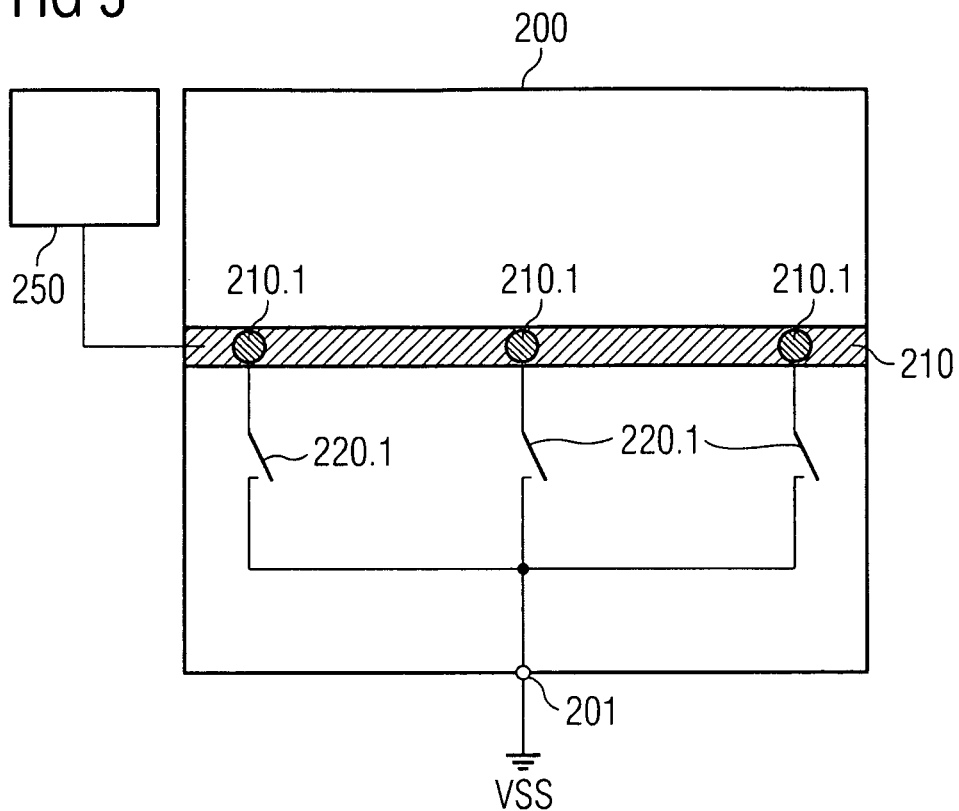
FIG. 5 shows a schematic representation of an embodiment of a switching circuit.

Referring to FIG. 5, there is shown a schematic representation of an embodiment of a switching circuit 200. The switching circuit 200 comprises a terminal 201 which is to be coupled to one of a supply voltage terminal (VDD) or a ground voltage terminal (VSS) of the integrated circuit. In the embodiment as depicted in FIG. 5 the terminal 201 is connected to the VSS terminal 202. The switching circuit 200 furthermore comprises a switched rail 210 which comprises a plurality of nodes 210.1. The switching circuit 200 further comprises a plurality of switches 220.1 which are coupled between one of the nodes 210.1 and the terminal 201, respectively. A voltage detector circuit 250 is coupled to the switched rail 210 for detecting the voltage of the switched rail 210.

The switching circuit 200 as depicted in FIG. 5 can be used as a power switching circuit for switching electrical power to an integrated circuit, as will be shown later. In this case the switched rail 210 may be called switched power rail. The switching circuit 200 as depicted in FIG. 5 can also be used as a circuit for switching voltages from one terminal to another terminal in a general sense. The switching circuit 200 as depicted in FIG. 5 can also be used for the charging and discharging of capacitors or for the monitoring of signal transition times. In all of these embodiments the switching circuit 200 can be a part of a standard cell of a cell-based integrated circuit.

The switching circuit 200 as depicted in FIG. 5 can be arranged to take one of a connected state, a disconnected state and an intermediate state. In the connected state all switches 220.1 are closed, in the disconnected state all switches 220.1 are opened, and in the intermediate state first switches (not shown in FIG. 5) of the plurality of switches 220.1 are closed and second switches of the plurality of switches (not shown) are opened, respectively. Furthermore, the switching circuit can comprise an input for receiving a first control signal indicating that the switching circuit 200 has to change from the disconnected state to the connected state, and the switching circuit 200 is arranged to close the first switches upon receiving the first control signal. The voltage detector 250 can then comprise an output to output a second control signal for closing the second switches. The voltage detector circuit 250 or a separate control circuit coupled to the voltage detector circuit 250 is arranged to output the second control signal upon detecting that the voltage of the switched rail 210 has reached a predetermined level.

The switching circuit 200 can comprise a thyristor circuit coupled to the switched rail 210. Being provided a first supply voltage terminal and a second supply voltage terminal, the thyristor circuit can be coupled between the first supply voltage terminal and the switched rail 210 and the switched rail 210 can be coupled between the thyristor circuit and the second supply voltage terminal. One of the first switches can be coupled between the switched rail 210 and the second supply voltage terminal. The thyristor circuit can be coupled to the voltage detector circuit 250. Furthermore, during the connected state the thyristor circuit can provide a first output voltage corresponding to the first supply voltage and a second output voltage corresponding to the second supply voltage and the thyristor circuit can supply the second output voltage to the voltage detector circuit 250. During the intermediate state the first output voltage of the thyristor circuit can be supplied to a circuit for connecting the switched rail to the input of the voltage detector circuit 250.

The voltage detector circuit 250 can be any circuit arranged to detect a voltage. The voltage detector 250 can, for example, comprise a Schmitt-Trigger circuit or it can also comprise a comparator circuit.

Figure 6:
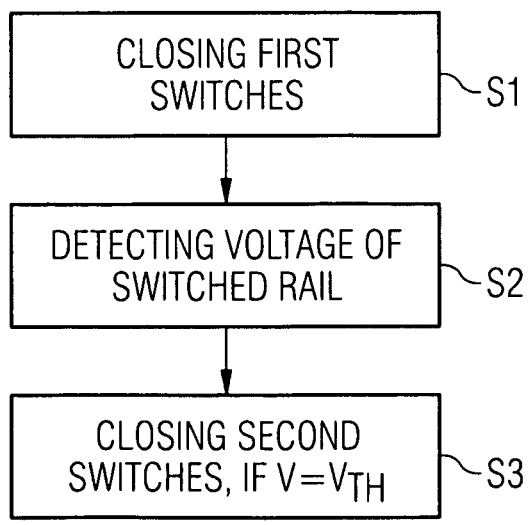
FIG. 6 shows a schematic representation of an embodiment of a method for switching a connection between a first terminal and a second terminal.

Referring to FIG. 6, there is shown a flow diagram representation of an embodiment of a method for switching a connection between a first terminal and a second terminal. There is provided a configuration comprising a switched rail having a plurality of nodes, and a plurality of switches, each one of the switches being coupled between one of the nodes and one of the first and second terminals. The method performs switching from a disconnected state, in which all switches are opened, to a connected state, in which all switches are closed. In a first step 610, first switches are closed. In a second step 620, the voltage of the switched rail is detected. In a third step 630, second switches are closed upon detecting that the voltage V of the switched rail has reached a predetermined value $V_{TH}$.

It can be provided that the first switches are closed after receiving a control signal indicating that switching from the disconnected state to the connected state is to be performed.

The configuration may further comprise a first supply voltage terminal and a second supply voltage terminal and a thyristor circuit can be coupled between the first supply voltage terminal and the switched rail 210 and the switched rail 210 can be connected between the thyristor circuit and the second supply voltage terminal. It can be provided that during the connected state the thyristor circuit outputs a first output voltage corresponding to the first supply voltage and a second output voltage corresponding to the second supply voltage, and that during the disconnected state the first output voltage is utilized for connecting the switched rail 210 to a voltage detector circuit for detecting the voltage of the switched rail 210.

Figure 7:
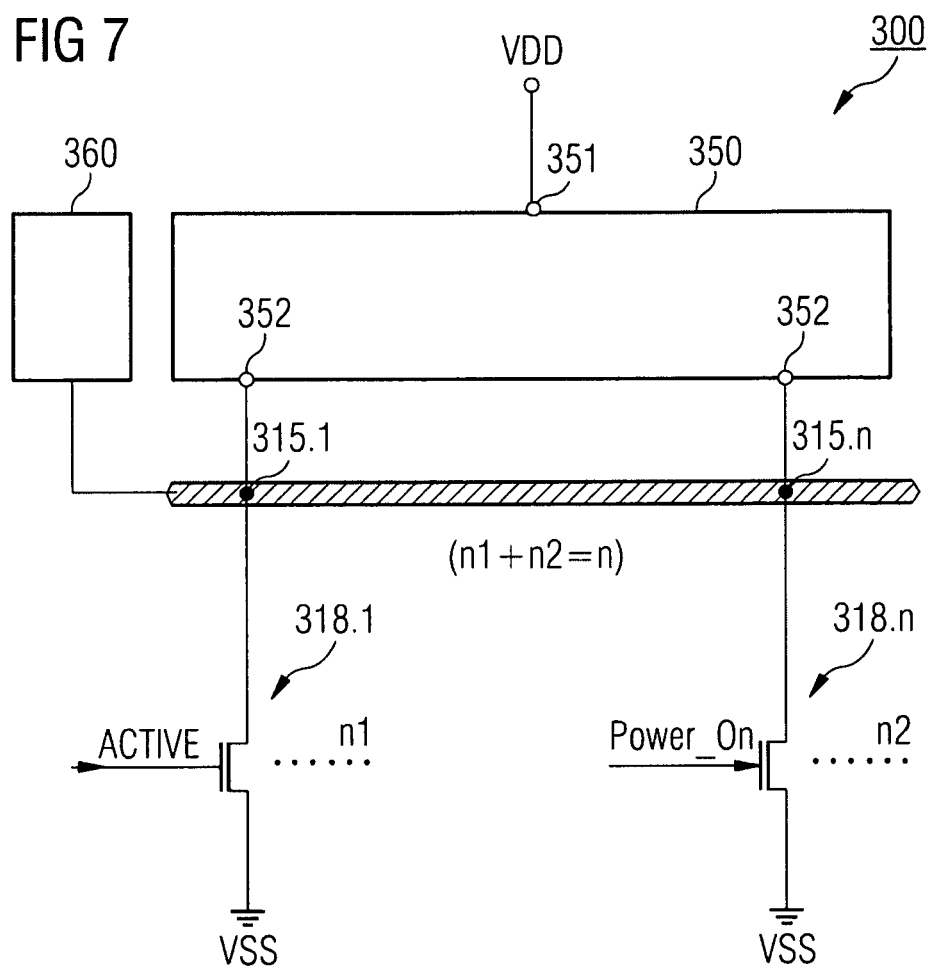
FIG. 7 shows a schematic representation of a further embodiment of a switching circuit.

Referring to FIG. 7, there is shown a schematic representation of a further embodiment of a switching circuit. The switching circuit 300 is provided for switching power to a circuit block 350. The circuit block 350 is connected with a first terminal 351 to a supply voltage terminal VDD 351. The circuit block 350 comprises second terminals 352 which are connected to a switched power rail 315. The switched power rail 315 comprises nodes 315.1 to 315.$n$ which are, respectively, connected to the second terminals 352 of the circuit block 350. The nodes 315.1 to 315.$n$ are also connected to switches 318.1 to 318.$n$, which are also called U-switches. The switches 318.1 to 318.$n$ are, respectively, connected to a ground voltage terminal VSS 319. The switches 318.1 to 318.$n$ can, for example, be MOS transistors.

In a state in which the switched power rail 315 is fully connected with the ground voltage terminal VSS (connected state), the switches 318.1 to 318.$n$ are closed and the switched power rail 315 with its nodes 315.1 to 315.$n$ and the second terminals 352 of the circuit block 350 lie on VSS potential in a normal operation of the circuit block 350. When a situation occurs in which the circuit block 350 is not needed, it is decided to switch it off. This is done by opening the switches 318.1 to 318.$n$ and thus disconnecting the switched power rail 315 from the VSS terminal. As a result, the voltage of the switched power rail 315 floats from a VSS voltage to a VDD voltage (see also FIG. 9).

When it is decided to activate the circuit block 350 again, a corresponding signal ACTIVE is set to "1" and applied to a certain predetermined number n1 of switches 318.1 to 318.$n1$. The value of n1 can, in principle, be any number between 1 and n. However, it can also be that n1 is only a small integer value. The result will be that the voltage of the switched power rail 315 slowly changes its value from VDD in the direction of VSS and by far not as fast as if all the switches 318.1 to 318.n would have been closed at once. After a certain time interval has passed by, a further signal POWER_ON is set to "1" and applied to the remaining switches 318.(n1+1), ..., 318.n to close these switches. The number of remaining switches is n2 so that n1+n2=n. The duration of the time interval can, for example, be determined by the actual voltage of the switched power rail 315. For this purpose there is provided a voltage detector circuit 360 which is coupled to the switched power rail 315 for detecting the voltage of the switched power rail 315. For example, it can be determined that if the actual voltage of the switched power rail 315 has dropped from VDD to VDD/3 then the signal POWER_ON is set to "1" and applied to the remaining n2 switches. When the circuit block 350 is again to be switched off, both signals ACTIVE and POWER_ON are again simultaneously set to "0" to open all U-switches again and so on.

In the previous embodiment it has been described that the voltage detector circuit 250 (FIG. 5) detects whether the voltage of the switched rail has reached a particular voltage level and then outputs a signal to close the second remaining switches. It can also be provided that there are not only first and second switches, but, for example, first, second and third switches or even more groups of switches and that the voltage detector circuit monitors the switched rail 315 to reach a first voltage level for switching second switches, then monitor the switched rail 315 to reach a second voltage level for switching third switches, and so on.

The ground voltage VSS 319 is re-connected to the second terminals 352 of the circuit block 350 in a somewhat delayed manner. This helps to avoid excessive voltage drops and to avoid affecting neighboring circuit blocks which would occur if VSS would be suddenly re-connected to the first terminal 301 and thus to the circuit block.

Figure 8:
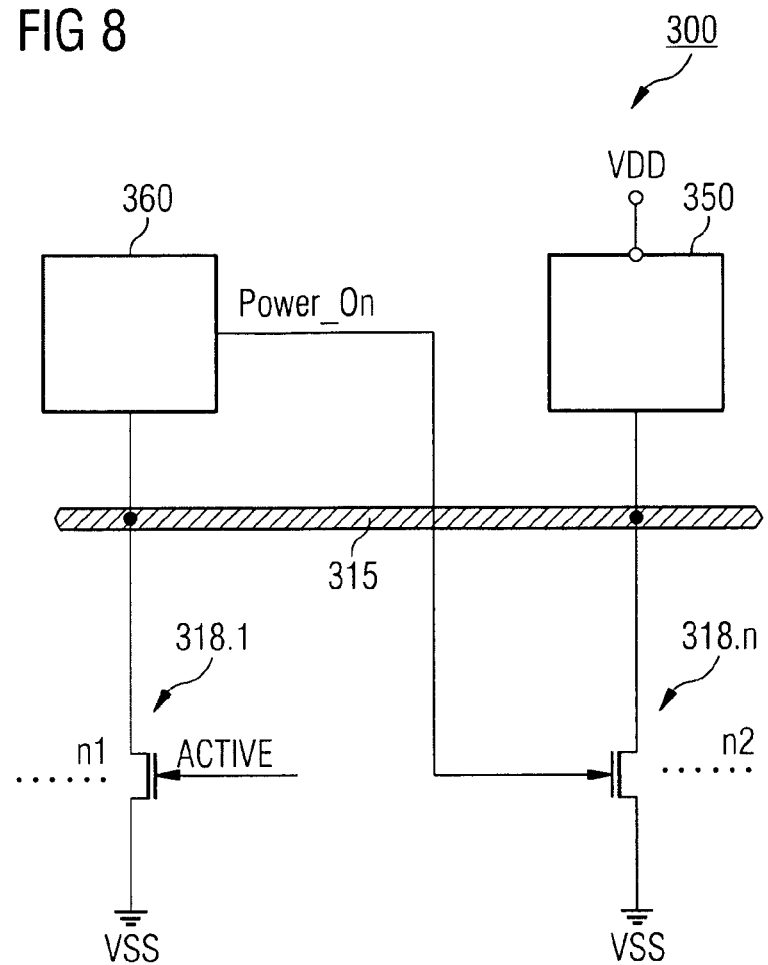
FIG. 8 shows a schematic representation of a further embodiment of a switching circuit.

Referring to FIG. 8, there is shown a schematic representation of a further embodiment of a switching circuit. The switching circuit 300 as depicted in FIG. 8 in principle corresponds to the switching circuit 300 as depicted in FIG. 7. The voltage detector circuit 360 is also coupled to the remaining n2 switches. When the voltage detector circuit 360 detects a voltage of the switched power rail 315 having reached a predetermined value, it sets an output signal POWER_ON to "1" for outputting it to the n2 switches in order to close them. The predetermined value can, for example, be controlled and adjusted depending on the circumstances and the situation. For example, the predetermined value of the measured actual voltage of the switched power rail 315 can be set to VDD/3. The voltage detector circuit 360 can, for example, be a Schmitt-Trigger circuit. It can also be implemented by an analog comparator circuit.

Figure 9:
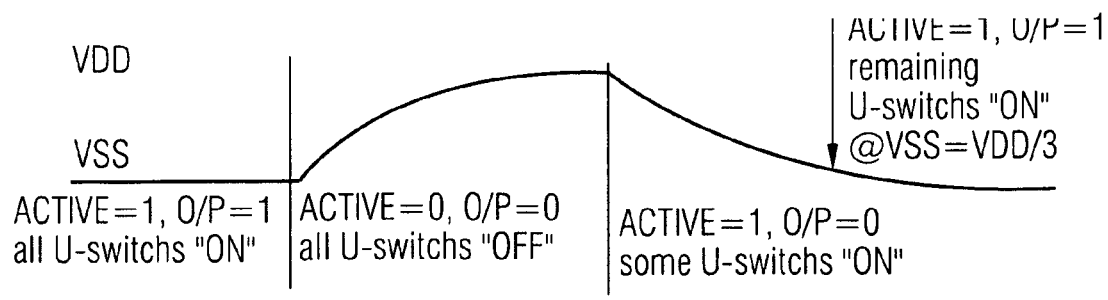
FIG. 9 shows a diagram of the time dependency of the voltage of the switched rail during the switching phases.

Referring to FIG. 9, there is shown a graph showing the time dependence of the actual voltage of the switched power rail 315 (FIG. 7) in the different switching phases. At the beginning 901, which is shown on the left, all U-switches are closed ("ON") and the voltage of the switched power rail 315 is equal to the VSS voltage. At the start of the next switching phase 902, it is decided to switch off the circuit block 315 and therefore to open all U-switches ("OFF"). This is done by setting the signal ACTIVE to "0". During this switching phase the actual voltage value of the switched power rail 315 floats from VSS to VDD. At the start of the next switching phase 903, it is decided that the circuit block 350 has to be activated again so that the signal ACTIVE is set to "1" so that some U-switches, i.e., the n1 switches, are closed again. As a result, the actual voltage of the switched power rail 315 slowly decreases from the value VDD towards the value VSS. As soon as it has reached a value VSS=VDD/3 (see arrow 904 in FIG. 7), the signal POWER_ON is set to "1" (O/P=1) so that the remaining n2 U-switches are closed.

Figure 10:
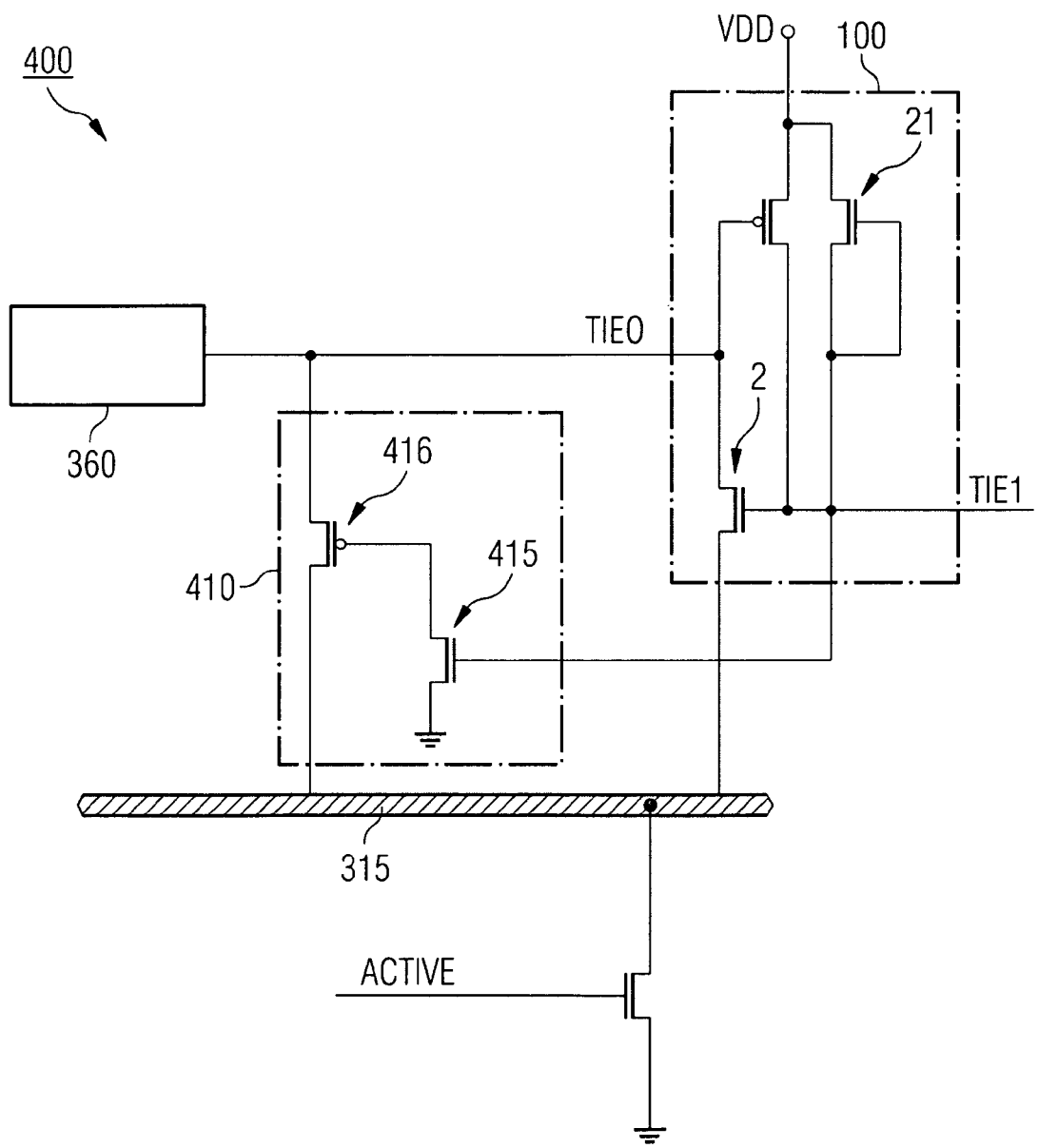
FIG. 10 shows a schematic representation of an embodiment of a power-switching circuit in connection with an electronic circuit for generating static reference voltages.

Referring to FIG. 10, there is shown a schematic representation of a further embodiment of a switching circuit. The switching circuit 400 as depicted in FIG. 10 is in principle a combination of the switching circuit 300 as depicted in FIG. 6 and the standard cell 10 as depicted in FIG. 2. Some of the elements as depicted in FIG. 8 are omitted in FIG. 10 for the sake of visual simplicity. During normal operation, the switched power rail 315 lies on VSS potential so that the standard cell 10 (FIG. 1) is operable to provide static and stable output voltages TIE0 16 and TIE1 18 as described earlier. The circuit 410 (shown within dashed line) facilitates the monitoring of the switched power rail 315 by the voltage detector circuit 360. When the signal ACTIVE=1, the circuit 410 is connected to VSS 319 and when ACTIVE=0, the circuit 410 is disconnected. When ACTIVE=0, the switched power rail 315 floats towards VDD. For accurate VDD/3 detection, it is desirable that the floating conditions be transferred precisely to the detector 360. But as it is known, the transistor 2 can not transfer this condition entirely to TIE0 16, which is the input of the VDD/3 detector 360. To alleviate this situation, the p-channel diode 21 in conjunction with the n-channel gate 415 channels the global ground VSS to the p-channel transistor 416. The p-channel transistor 416 in turn passes the true value of the floating condition to the TIE0 16 terminal. The TIE0 16 is input to the detector 360 and is designed to trigger at a specific value of the switched VSS power rail 315 going down with ACTIVE=1 again. The detector 360 can either by itself output a signal to control the switches or provide a signal to a U-switch controller to start the simultaneous switching of all the remaining U-switches.

What is claimed is:

1. A cell-based integrated circuit, comprising:
a first supply voltage terminal and a second supply voltage terminal;
a standard cell comprising a thyristor circuit comprising a first input to input a first supply voltage, a second input to input a second supply voltage, a first output to output a first output voltage corresponding to the first supply voltage, and a second output to output a second output voltage corresponding to the second supply voltage;
a voltage detector coupled to the thyristor circuit, the voltage detector circuit comprises a comparator circuit,
wherein the standard cell further comprises a start-up device coupled to the thyristor circuit and the start-up device is a diode, including one of a transistor diode and a non-transistor diode.

2. The cell-based integrated circuit according to claim 1, wherein the thyristor circuit comprises a first metallic-oxide semiconductor (MOS) transistor and a second MOS transistor, wherein a gate of the first MOS transistor is coupled to a first source/drain terminal of the second MOS transistor, and a gate of the second MOS transistor is coupled to a first source/drain terminal of the first MOS transistor.

3. The cell-based integrated circuit according to claim 2, wherein a second source/drain terminal of the first MOS transistor is coupled to the first supply voltage terminal and a second source/drain terminal of the second MOS transistor is coupled to the second supply voltage terminal.

4. The cell-based integrated circuit according to claim 1, wherein the second supply voltage terminal is a ground voltage terminal.

5. A method of operating a thyristor circuit in a standard cell of a cell-based integrated circuit, the thyristor circuit comprises a first MOS transistor and a second MOS transistor, comprising:

providing a first supply voltage and a second supply voltage in the standard cell and supplying the first and the second supply voltages to the thyristor circuit;
operating the thyristor circuit such that it delivers at a first output thereof a first output voltage corresponding to the first supply voltage and at a second output thereof a second output voltage corresponding to the second supply voltage, supplies the second output voltage to a voltage detector circuit, the voltage detector circuit comprises a comparator circuit; and
operating the thyristor circuit comprises starting up the thyristor circuit by supplying an external voltage thereto.

6. The method according to claim 5, wherein the thyristor circuit comprises a first bipolar transistor and a second bipolar transistor; and operating the thyristor circuit comprises starting up the thyristor circuit by supplying an external current thereto.

7. A switching circuit, comprising:
a terminal coupled to a supply voltage;
a switched rail comprising a plurality of nodes;
a plurality of switches, each one of the switches being coupled between one of the nodes and the terminal; and
a voltage detector circuit coupled to the switched rail to detect the voltage of the switched rail, wherein the voltage detector circuit comprises a comparator circuit.

8. The switching circuit according to claim 7, wherein the switching circuit is arranged to take one of the following states: a connected state in which all switches are closed; a disconnected state in which all switches are opened; and an intermediate state in which first switches are closed and second switches are opened.

9. The switching circuit according to claim 8, wherein the switching circuit further comprises an input to receive a first control signal indicating that the switching circuit has to change from the disconnected state to the connected state; and the switching circuit is arranged to close the first switches upon receiving of the control signal.

10. The switching circuit according to claim 7, wherein the voltage detector circuit comprises an output to output a second control signal to close the second switches.

11. The switching circuit according to claim 10, wherein the voltage detector circuit is arranged to output the second control signal upon detecting that the voltage of the switched rail has reached a predetermined level.

12. The switching circuit according to claim 7, further comprising: a thyristor circuit coupled to the switched rail.

13. The switching circuit according to claim 12, further comprising: a first supply voltage terminal and a second supply voltage terminal, wherein the thyristor circuit is coupled between the first supply voltage terminal and the switched rail and the switched rail is coupled between the thyristor circuit and the second supply voltage terminal.

14. The switching circuit according to claim 12, wherein the thyristor circuit is coupled to the voltage detector circuit.

15. The switching circuit according to claim 8, wherein during the connected state the thyristor circuit provides a first output voltage corresponding to the first supply voltage and a second output voltage corresponding to the second supply voltage, wherein the thyristor circuit supplies the second output voltage to the voltage detector circuit, and during the intermediate state the first output voltage of the thyristor circuit is supplied to a circuit to connect the switched rail to the input of the voltage detector circuit.

16. The cell-based integrated circuit according to claim 1, wherein the first supply voltage and the second supply voltage are unique.

17. The method according to claim 5, wherein the first supply voltage and the second supply voltage are unique.

* * * * *